United States Patent
Woo et al.

(10) Patent No.: US 7,408,354 B2
(45) Date of Patent: Aug. 5, 2008

(54) PHANTOM FOR EVALUATING MAGNETIC RESONANCE SPECTROSCOPY PERFORMANCE

(75) Inventors: Dong-Cheol Woo, Seoul (KR); Bo-Young Cheo, Seoul (KR); Sung-Ik Yoon, Seoul (KR); Moon-Hyun Yoon, Seoul (KR); Sung-Tak Hong, Seoul (KR)

(73) Assignee: Catholic University Industry Academic Cooperation Foundation, Seoul (KR)

( * ) Notice: Subject to any disclaimer, the term of this patent is extended or adjusted under 35 U.S.C. 154(b) by 0 days.

(21) Appl. No.: 11/682,994

(22) Filed: Mar. 7, 2007

(65) Prior Publication Data
US 2007/0210796 A1    Sep. 13, 2007

Related U.S. Application Data

(60) Provisional application No. 60/821,581, filed on Aug. 7, 2006.

(30) Foreign Application Priority Data
Mar. 7, 2006    (KR) .......................... 2006-0021269

(51) Int. Cl.
*G01V 3/00*     (2006.01)
*A61B 5/055*    (2006.01)

(52) U.S. Cl. ....................... 324/321; 324/318; 324/309; 324/307; 600/411; 600/416

(58) Field of Classification Search ......... 324/318–322, 324/300, 307, 309; 600/410, 411, 416, 474, 600/549; 250/214 VT
See application file for complete search history.

(56) References Cited

U.S. PATENT DOCUMENTS

| | | | | |
|---|---|---|---|---|
| 4,625,168 A * | 11/1986 | Meyer et al. | ................. | 324/300 |
| 4,816,762 A * | 3/1989 | Bohning | ..................... | 324/300 |
| 4,888,555 A * | 12/1989 | Vaughan et al. | ............. | 324/318 |
| 5,005,578 A * | 4/1991 | Greer et al. | ................. | 600/414 |
| 5,165,050 A * | 11/1992 | Goodenough et al. | ........ | 324/318 |
| 5,656,807 A * | 8/1997 | Packard | ................ | 250/214 VT |
| 5,994,900 A * | 11/1999 | Gurvich | ..................... | 324/300 |
| 6,614,228 B2 * | 9/2003 | Hofmann et al. | ............ | 324/321 |
| 6,615,071 B1 * | 9/2003 | Casscells et al. | ............ | 600/474 |
| 6,763,261 B2 * | 7/2004 | Casscells et al. | ............ | 600/474 |
| 2002/0088946 A1 * | 7/2002 | Hofmann et al. | ............ | 250/489 |
| 2003/0028114 A1 * | 2/2003 | Casscells et al. | ............ | 600/474 |
| 2003/0171691 A1 * | 9/2003 | Casscells et al. | ............ | 600/549 |

* cited by examiner

*Primary Examiner*—Brij Shrivastav
*Assistant Examiner*—Tiffany A Fetzner
(74) *Attorney, Agent, or Firm*—Rafferty Patent Law Firm

(57) ABSTRACT

A phantom for evaluating a magnetic resonance spectroscopy (MRS) performance is provided. Specifically, a phantom for evaluating an MRS performance capable of quantitatively evaluating a resolution of a spectrum obtained when a chemical shift imaging MRS measurement process is performed is provided. The phantom evaluates MRS performance using a magnetic resonance imaging (MRI) apparatus, and includes: an external container having an opened upper end; internal containers which are disposed in the external container and constructed so as to include metabolites; and an external container cover for covering the upper end of the external container.

7 Claims, 12 Drawing Sheets

| Figure 4 | Metabolite Volume in a Voxel | Amplitude | Area | FWHM |
|---|---|---|---|---|
| A | 4.8433 | 0.01147 | 0.06675 | 3.7048 |
| B | 2.4871 | 0.00669 | 0.0295 | 2.8078 |
| C | 0.9163 | 0.00272 | 0.00381 | 0.89256 |

PHANTOM FOR EVALUATING MAGNETIC RESONANCE SPECTROSCOPY PERFORMANCE

CROSS-REFERENCE TO RELATED APPLICATIONS

The benefit of priority is claimed to U.S. Provisional Patent Application No. 60/821,581, filed Aug. 7, 2006, with the United States Patent & Trademark Office, and to Republic of Korea Patent Application No. 10-2006-0021269, filed Mar. 7, 2006, with the Korean Intellectual Property Office, the disclosures of which are incorporated herein by reference in their entireties.

BACKGROUND

The present disclosure relates to a phantom for evaluating magnetic resonance spectroscopy (MRS) performance, and more specifically, to a phantom for evaluating an MRS performance capable of quantitatively evaluating a resolution of a spectrum obtained when a chemical shift imaging MRS measurement process is performed.

RELATED ART

In general, the magnetic resonance spectroscopy (MRS) method has been known as an excellent technique among the analyzing methods used in chemistry and biochemistry fields. The MRS method has been actively used in the clinical field since 1990. However, the MRS method is used in the cranial nerve science field related to a brain that is an almost immovable organ, due to various technical limitations.

In the MRS method, when an object to be measured is placed in a magnetic field, the variation of a magnetic resonance signal (frequency) with respect to an applied radio frequency (RF) pulse is accurately measured, and the structure, constituents, and states of the object are quantitatively measured. Accordingly, biochemical information according to the mechanical operation of metabolites can be obtained using a method that is not harmful with respect to the object to be measured. The biochemical information is determined depending on the types of molecule composition in the sample.

The mechanism of the MRS method is to analytically and chemically distinguish elements using the fact that the innumerable protons in a human body have characteristic magnetic resonance frequencies having minute differences and determine a molecule structure. The MRS data is represented as a spectrum that indicates various signal intensities by using reference compounds that provides frequencies of reference points. Each peak position is represented as a function of a frequency (Hz). Although protons which constitute different tissues are the same protons, nonetheless the protons constituting different tissues respectively have slightly different chemical and magnetic properties. That is, local magnetic fields are different. Accordingly, the resonance frequencies are also different, thereby easily distinguishing the difference through the spectrum.

In order to evaluate the performance of an MR system, an MR phantom has been developed to accurately analyze errors of MR systems. There hasn't been much interest in developing more advanced phantoms after the initial phantoms for a MR imaging were released. Hence, the evaluation of the spectrum for each voxel of a multi-voxel spectroscopy (MVS) image, such as magnetic resonance spectroscopic imaging (MRSI) and magnetic resonance metabolic imaging (MRMI), is unreliable because the exclusive MVS phantom has not been used but the general MRS phantom was used, which included many mixed metabolites in the single vial. The application of MVS in clinical medicine for radio-surgery, human brain metabolic mapping and the diagnosis of brain diseases has recently been increasing and MVS development is very active. So, the MR phantom has a new function for conducting accurate MVS.

On the other hand, since the human body is constructed by different kinds of parts, a position determination process is necessary so as to clinically apply the MRS method. When the position determination process is imperfect, signals are contaminated due to an influence of tissues which are not in a region of interest (ROI), and therefore the desired spectrum cannot be obtained in the ROI.

A localization method that is one of the position determination processes includes a unit volume selection method in which a specific voxel is selected and a magnetic resonance spectrum is obtained in that portion and a chemical shift selection method in which magnetic resonance spectra are concurrently obtained in each slice by dividing the region into a plurality of successive slices. The unit volume selection method can simply obtain information in a short time. Since the size of the information is small, a mass storage medium is unnecessary. The unit volume selection method is relatively not sensitive to the artificial shaking materials. The possibility of contaminating signals is small. On the other hand, in the chemical shift selection method, since the variation of the metabolites in the various parts can be concurrently measured, properties of the tissues can be compared with one other at the same time. In addition, selective images of the metabolites can be produced.

When the MRS measurement process is performed, the object to be measured is inserted in the apparatus, thereby distorting the magnetic field due to the difference in the magnetic susceptibilities of the parts. In order to compensate for the distortion of the magnetic field and recover the uniformity of the magnetic field, a magnetic field correction process that is a shimming process has to be performed.

In order to recover the uniformity of the magnetic field, there is needed a phantom, which allows errors to be easily analyzed by previously measuring the spectrum obtained when the MRS measurement process is performed. The phantom is an object to be measured in the MRS measurement process using the MRI apparatus and a tool which allows the spectrum of the metabolites contained in the phantom to be obtained and allows a position to be determined when the MRS measurement is performed by recognizing the shimming state of the MRI apparatus through the obtained spectrum.

In the past, in the unit volume selection method, a phantom in which various metabolites are mixed was used. In the chemical shift selection method, it is difficult to evaluate the reliability of the spectrum obtained in each voxel, accordingly an accurate diagnosis and a cure cannot be performed.

SUMMARY

In accordance with one aspect of the present disclosure, a phantom is provided for evaluating a magnetic resonance spectroscopy (MRS) performance using a magnetic resonance imaging (MRI) apparatus capable of improving reliability of a spectrum by allowing a position in the MRI apparatus to be determined when an MRS measurement process is performed through the obtained spectrum analysis by performing the MRS measurement process through a chemical shift imaging technique by using a phantom constructed by injecting various metabolites into a plurality of internal containers having the same shape, which are arranged in a matrix shape.

According to another aspect, there is provided a phantom for evaluating an MRS performance when an MRS measurement process is performed by using an MRI apparatus, the phantom including an external container having an opened upper end, a plurality of internal containers which are disposed in the external container and constructed so as to include metabolites, and an external container cover for covering the upper end of the external container.

BRIEF DESCRIPTION OF THE DRAWINGS

The above and other features and advantages of the present invention will become more apparent by describing in detail exemplary embodiments thereof with reference to the attached drawings in which:

FIGS. 7(A), 7(B), 7(C) and 7(D) show the voxel positions and metabolite spectrums, in which each metabolite in the voxel position can be identified on the basis of Table 2 and FIG. 5, and in which FIG. 7(A) illustrates the spectrum of the brain mimicking solution, in which the NAA, Cr, and Cho peaks are clearly observed; FIG. 7(B) illustrates the spectrum in the NAA cone, in which only the NAA peak is clearly seen; FIG. 7(C) illustrates the spectrum in the Cho cone, in which only the Cho peak is clearly seen; and FIG. 7(D) illustrates the spectrum in the Cr cone, in which only the Cr peak is clearly seen.

DETAILED DESCRIPTION

In accordance with one aspect, a cone-shape phantom for multi-voxel magnetic resonance spectroscopy (MRS) and to evaluate MR spectra using the cone-shape phantom is provided.

A cone-shape MRS phantom was developed with a combination of cone-shape vials. The cylindrical main body was made of acrylic resin and the cone-shape vials were fabricated from poly-ethylene cones. Each cone of the phantom was filled with various metabolite materials (i.e., NM, Cr, Cho, Lac, GABA, Glx, Magnevist™, etc.). 1.5T GE and 3T Philips systems were used for the single voxel spectroscopy (SVS) as well as for the multi-voxel spectroscopy (MVS). Identification and quantification of the metabolite materials in the cone-shape phantom were done by the SAGE post-program. The Philips raw data was directly analyzed at the console.

The MR images and spectra of the cone shape phantom were obtained from the assigned slice position. The high order shimming control provided enhanced resolution in the SVS and MVS. The area and amplitude were proportional to the metabolite volume in the voxel. The metabolite quantification by the area of a spectrum was more sensitive than that by the amplitude of a spectrum.

It was demonstrated that the cone-shape phantom was useful for the metabolite quantification. Thus, the cone-shape phantom can be used for the evaluation of quality control of the MR spectra obtained from SVS and MVS.

Hereinafter, exemplary embodiments are discussed with reference to the attached drawings. The invention may, however, be embodied in any of a variety of different forms and should not be construed as being limited to the embodiments set forth herein.

Figure 1:
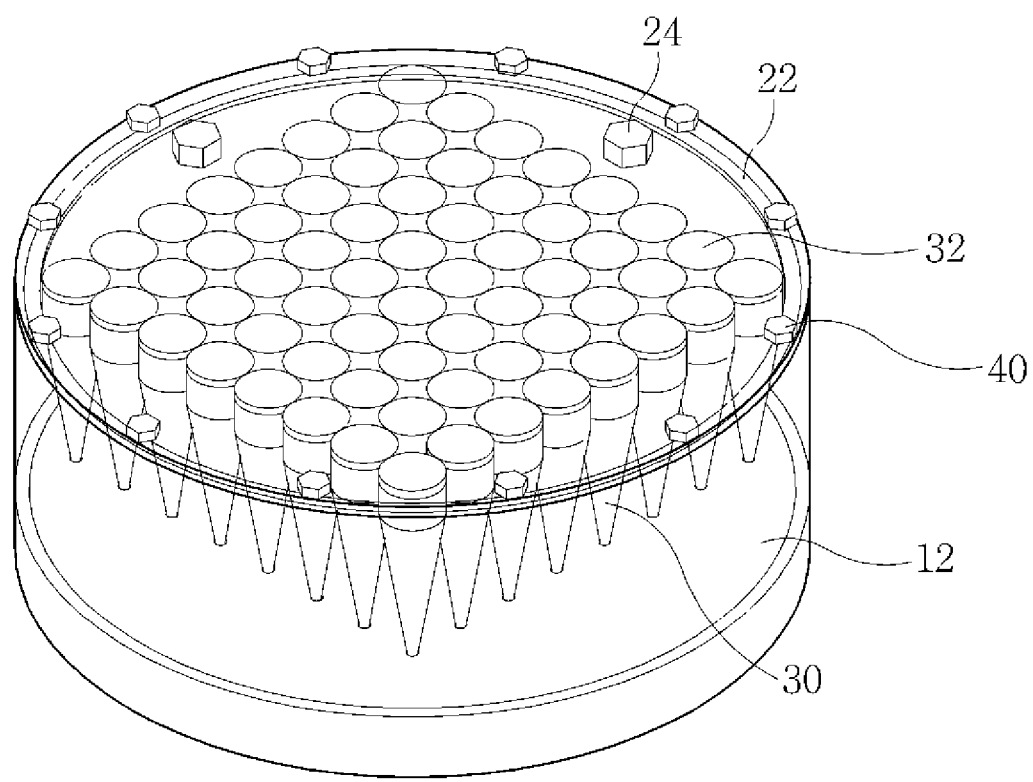
FIG. 1 is a perspective view illustrating a phantom for evaluating a magnetic resonance spectroscopy (MRS) performance by using a magnetic resonance imaging (MRI) apparatus.
Figure 2:
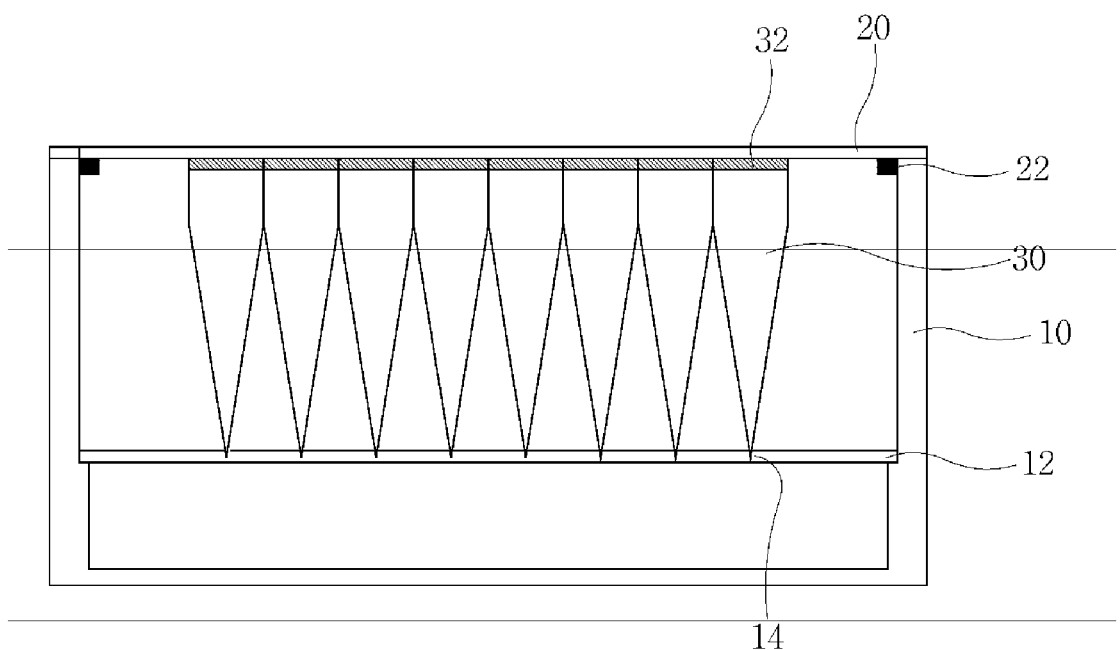
FIG. 2 is a cross sectional view illustrating the phantom shown in FIG. 1.

FIG. 1 is a perspective view illustrating a phantom for evaluating a magnetic resonance spectroscopy (MRS) performance using a magnetic resonance imaging (MRI) apparatus according to a first embodiment. FIG. 2 is a cross sectional view illustrating the phantom shown in FIG. 1.

The phantom for evaluating the MRS performance using the MRI apparatus according to the first embodiment has a cylindrical shape of which the upper end is open. The phantom includes an external container 10 which is filled with distilled water, internal containers 30 which are arranged in a matrix shape and constructed so as to include metabolites, internal container stoppers 32 which close the internal containers 30, an external container cover 20 which covers the external container 10, and engagement members 40 which engage the external container 10 with the external container cover 20.

The structure of the phantom for evaluating the MRS performance using the MRI according to the first embodiment is described below.

The external container 10 which forms an exterior shape of the phantom is made of a transparent acrylic material. The external container 10 has a cylindrical shape. In addition, in the external container 10, a fixing plate 12, which partitions the external container 10 in a width direction, is spaced apart from the lower end of the external container 10 by a predetermined distance, and fixing grooves 14 are formed on the fixing plate 12 so as to determine positions of the internal containers 30 and fix the internal containers 30. In the first embodiment, the external container 10 has a diameter of 25 cm.

The external container 10 is filled with distilled water except the space which the internal containers occupy.

The internal containers 30 are made of a polymer resin based material. The internal containers 30 are arranged in an n×n matrix shape in the external container 10. In the first embodiment, the internal containers 30 are arranged in an 8×8 matrix shape. The internal containers 30 may have various shapes. The shapes are needed so as to obtain various spectrum images through one MRS measurement process by separately injecting various metabolites into the internal containers. In the first embodiment, the internal containers have a cone shape with a diameter of 2 cm and a height of 8 cm. In the first embodiment, the internal containers 30 have a cone shape, because the amounts of the metabolites included in the measured cross sections are different according to the heights of the internal containers 30. Accordingly, the MRS measurement process can be performed while changing the positions of the internal containers 30 so as to obtain optimal spectrum when the MRS measurement process is performed. The detailed description is described in the following description with respect to FIG. 4.

In addition, the upper ends of the internal containers 30 are constructed so as to be closed by internal container stoppers 32 having a cylindrical shape.

The internal container stoppers 32 are used to close the upper ends of the internal containers 30 so as to prevent the injected metabolites from flowing outside of the internal containers 30. The internal container stoppers 32 are made of rubber.

The internal containers 30 are fixed by being inserted in the fixing grooves 14 which are formed on the fixing plate 12 at the lower side of the external container 10.

The external container cover 20 is made of the same material as the external container. A rubber packing 22 is formed at a position in which the external container cover 30 is combined with the external container 10, so as to prevent the distilled water from flowing outside of the external container 10.

In addition, direction indicators 24 for indicating a direction of the phantom according to the first embodiment are formed on an upper surface of the external container cover 20. The external container 10 of the phantom according to the first embodiment has a cylindrical shape. Since the internal containers 30 included in the external container 10 are arranged in an n×n matrix shape, additional direction indicators 24 are needed so as to recognize the kinds of the metabolites injected into the internal containers 30.

The engagement members 40 tightly engage the external container 10 with the external container cover 20 and prevent the distilled water filling the external container 10 from flowing outside of the external container 10. In the first embodiment, screws are used as the engagement members 40.

An MRS measurement method using a phantom for evaluating an MRS performance using the MRI apparatus which has the aforementioned structure is described in the following.

Figure 3:
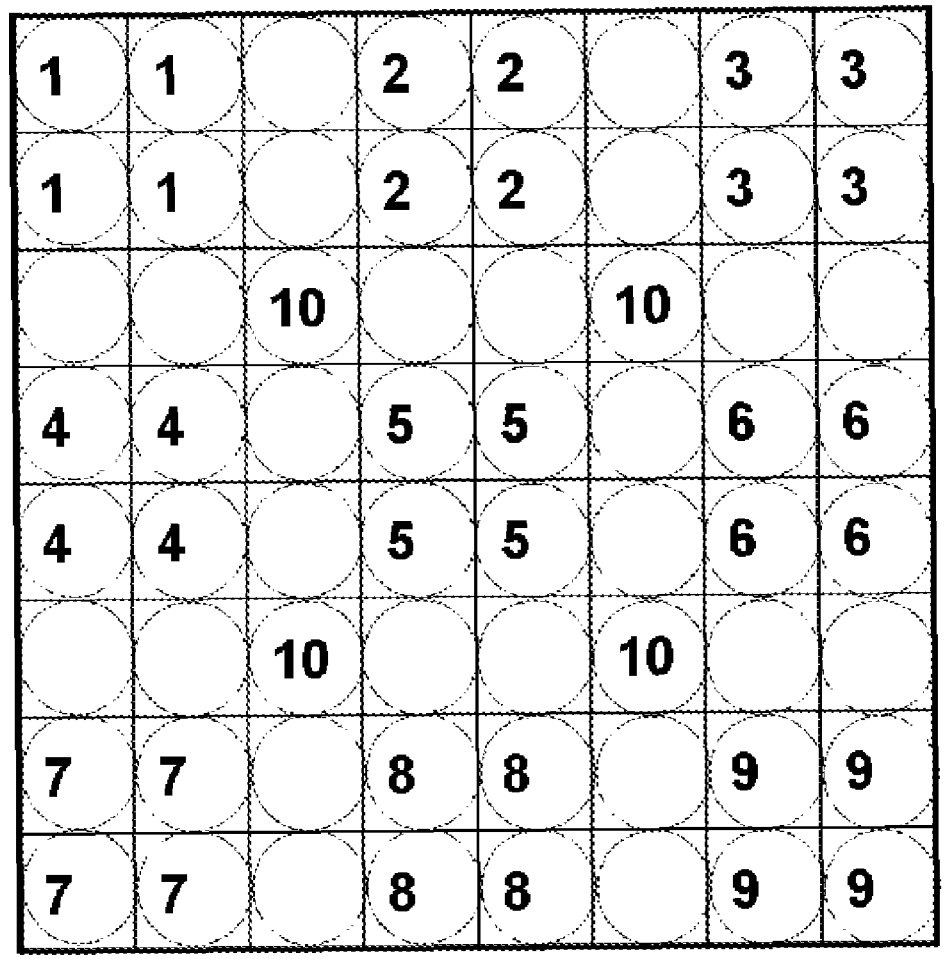
FIG. 3 is a conceptual view illustrating an example of internal containers into which various metabolites are injected in a phantom for evaluating an MRS performance using an MRI apparatus.

FIG. 3 is a conceptual view illustrating an example of internal containers into which various metabolites are injected in a phantom for evaluating an MRS performance using an MRI apparatus according to an embodiment of the present invention.

First, in the embodiment, the internal containers are arranged in an 8×8 matrix shape. The internal containers have a cone shape. The metabolites injected into the internal containers mainly include the metabolites which constitute a brain. Metabolites included in Table 1 and Table 2 are used as the aforementioned metabolites which constitute a brain.

TABLE 1

|   | Chemical name of metabolite | Amount of injected metabolite (mM) |
|---|---|---|
| 1 | L-Glutamic acid | 12.5 |
| 2 | Creatine | 10.0 |
| 3 | GABA(4-Aminobutyric acid) | 10.0 |
| 4 | Choline chloride | 3.75 |
| 5 | NAA(N-Acetyl-L-asparticl acid) | 12.5 |
| 6 | L-Glutamin | 12.5 |
| 7 | Myo-Inositol | 7.5 |
| 8 | L-Lactic acid | 5.0 |
| 9 | L-Alanine | 10.0 |
| 10 | Magnevist | 1 ml/l |

TABLE 2

|   | Chemical name of metabolite | Amount of injected metabolite (mM) |
|---|---|---|
| 1 | Potassium phosphate monobasic | 50.0 |
| 2 | Sodium hydroxide | 56.0 |
| 3 | NAA(N-Acetyl-L-asparticl acid) | 12.5 |
| 4 | Creatine | 10.0 |
| 5 | Choline chloride | 3.0 |
| 6 | Myo-Inositol | 7.5 |
| 7 | L-Glutamic acid | 12.5 |
| 8 | L-Lactic acid | 5.0 |
| 9 | Sodium azide | 0.01% |
| 10 | Magnevist | 1 ml/l |

The metabolites included in Table 1 are objects which are to be measured in the MRS measurement process. In the embodiment, the same metabolite is injected in the neighboring four internal containers, so as to prevent undesired spectra from being obtained due to influence of neighboring metabolites, when the MRS measurement process is performed. In addition, the metabolites included in Table 2 are mixed and injected into the rest of the internal containers into which the metabolites included in Table 1 are not injected. Since a solution obtained by mixing the metabolites included in Table 2 has a mixture ratio similar to that of metabolites that constitutes a human brain and includes one or more metabolites included in Table 1, the influence of the metabolites injected in the neighboring internal containers is alleviated when the MRS measurement process is performed.

FIG. 3 illustrates an example which represents a state in which metabolites included in Table 1 and Table 2 are injected into the internal containers. Numbered parts represent the internal containers into which metabolites included in Table 1 are injected. Non-numbered parts represent the internal containers into which metabolites included in Table 2 are injected. Here, parts numbered by the same number represent the internal containers into which the same metabolite is injected.

As shown in FIG. 3, the metabolites are injected into the internal containers because signals are contaminated in the internal containers which are not included in the interested region, and undesired signal exists on the spectrum when position determination is imperfect. In order to prevent the signals from being contaminated due to the metabolites injected into the peripheral internal containers, the same metabolite is injected into the four neighboring internal containers, and a mixed solution obtained by mixing various metabolites is injected into the rest of the internal containers. Specifically, the same metabolite among the metabolites included in Table 1 is injected into four neighboring internal containers, so as to minimize the influence due to other metabolites injected into the peripheral internal containers and alleviate the contamination of the spectrum of the metabolite injected into the internal containers, which is to be measured in the MRS measurement process, due to the influence of the peripheral metabolites by injecting the mixed solution constructed so as to include one or more metabolites among the metabolites included in Table 1.

Figure 4:
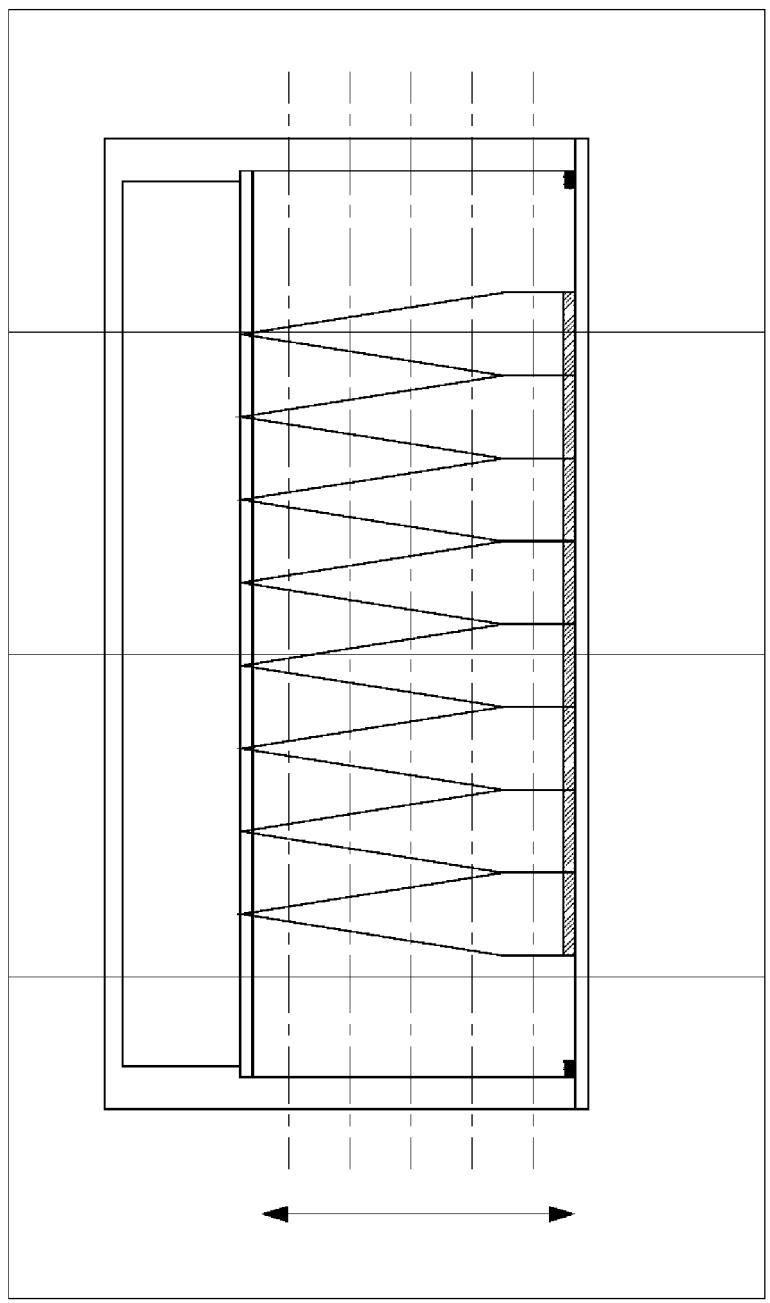
FIG. 4 illustrates a method of performing an MRS measurement process by using a phantom for evaluating an MRS performance using an MRI.

FIG. 4 is a conceptual view illustrating an example of performing an MRS measurement process while changing cross section positions of the internal containers so as to obtain a spectrum with optimized resolution, since the content of the metabolites is different according to the position of the cross section, when a phantom for evaluating an MRS performance using an MRI apparatus according to an embodiment of the present invention is included in the MRI apparatus, and the cone shaped internal containers are used.

In the embodiment, the MRS measurement process is performed at once and various spectra can be concurrently obtained by using the plurality of internal containers having the same shape. The desired spectrum can be obtained by changing the MRS measurement position when the internal containers have a cone shape. When the internal containers have the cone shape, since the distance between neighboring internal containers increases moving to the lower ends of the internal containers, the signal is prevented from being contaminated due to the metabolites injected into the peripheral internal containers. However, when the MRS measurement process is performed, since the amount of the metabolite decreases moving to the lower ends of the internal containers, the resolution of the obtained spectrum may be reduced. Accordingly, in order to solve the aforementioned problem, the spectrum with the optimized resolution can be obtained by selecting the cross section which suitably contains the metabolite when the MRS measurement process is performed by changing the positions of the internal containers as shown in FIG. 4.

The position at which the optimal spectrum can be obtained in the MRI apparatus can be determined by analyzing the obtained spectrum by performing the MRS measurement process by using the aforementioned method.

Since it can be recognized whether the position determination is suitably performed by using the phantom before the MRS measurement process is performed with respect to a human body by analyzing the spectrum obtained by using the MRS measurement result of the phantom, the position for MRS measurement can be determined by recognizing the distribution state of the magnetic filed according to the resolution of the spectrum.

As described above, various spectra with respect to various metabolites can be obtained through one MRS measurement process by using the phantom for evaluating an MRS performance using an MRI apparatus according to an embodiment of the present invention. In addition, since various spectra can be obtained according to the measurement positions of the phantom, the position at which the spectrum is not contaminated due to ununiformity of magnetic field of the MRI apparatus can be determined.

EXAMPLE 1

Metabolite Quantification in SVS

The metabolite quantification in the SVS was performed using the 1.5T GE MRI/MRS system (Model: Twinspeed) at Kangnam St. Mary's Hospital of Korea. This study focused on the NAA metabolite with the best shimming condition because it was located in the center. At 1.5T, NAA exhibits the longest T1 relaxation time (1300-1400 ms). Hence, for all the subsequent MR spectra acquired at 1.5T, a TR of 7000 ms ensured fully relaxed spectra. For the single voxel studies, on the basis of the scout scan, a cubic volume of interest (VOI) was chosen that partially enclosed a vial. For the SVS, shimming was performed on each VOI before data acquisition with using the manufacture's built-in linear shimming procedure (auto-shimming), and water suppression was achieved using a chemical shift imaging (CHESS) sequence. Although the partial volume effect necessarily occurred in this study, we expected that the results of the MRS were free from it. The SVS parameters used were as follows: room temperature, pulse sequence=stimulated echo acquisition mode (STEAM), TE/TR=30/2000 ms, NEX=8, voxel size=20×20× 20 $mm^3$, bandwidth of frequency=2500 Hz and data points=2048.

As the slice position changed, its images and spectra were obtained. With varying the voxel position in the same cone-shape vial, the volume of the metabolite in the voxel could be changed. Metabolite quantification of NAA was conducted for determining the volume of metabolite in the voxel. Data processing was conducted using the research version of SAGE 7.0 (Spectroscopy Analysis of GE). The peak fittings were performed with a Gaussian function and their area, amplitude and full width half maximum (FWHM) was calculated. Data were apodized with a 3 Hz Lorentzian function before Fourier transformation, and this was followed by phasing and baseline correction. The metabolite quantification of the NAA was conducted according to its peak amplitude, and the areas of each case were calculated.

Figure 5A:
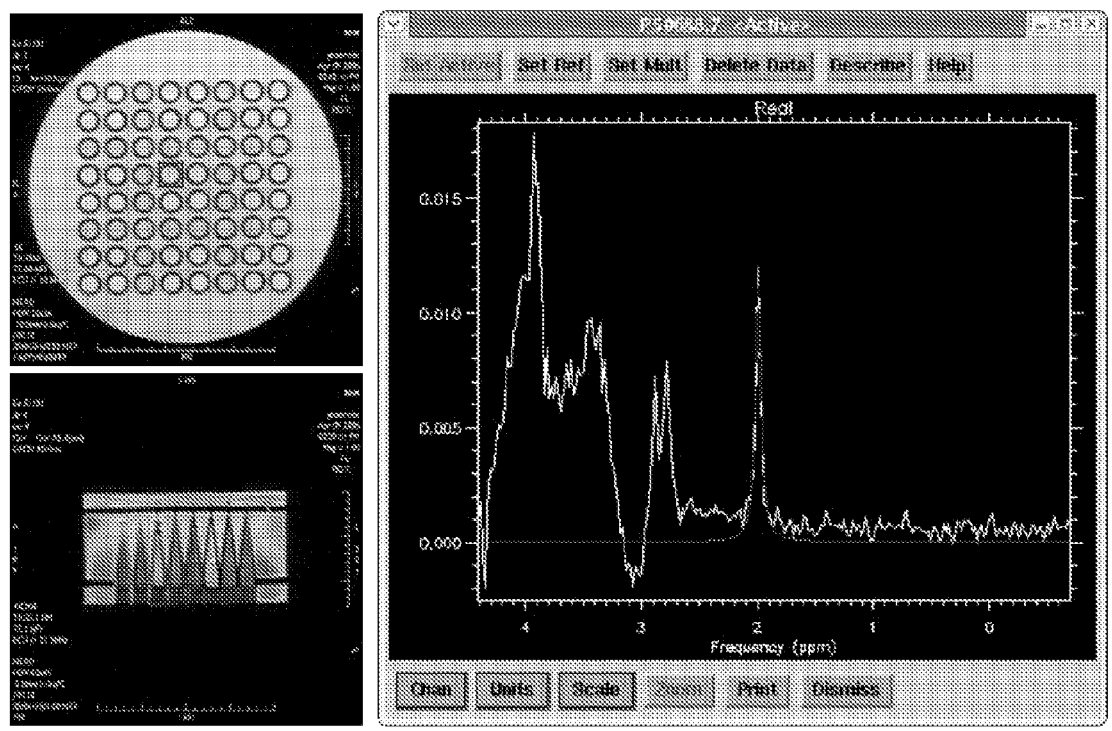
FIGS. 5(A), 5(B) and 5(C) show the voxel positions and spectra of the NAA in which, using these spectra, metabolite quantification was conducted according to the metabolite volume in the voxel, and in which the volume for FIG. 5(A) is 4.8433 cm$^3$, the volume for FIG. 5(B) is 2.4871 cm$^3$, and the volume for FIG. 5(C) is 0.9163 cm$^3$.
Figure 5B:
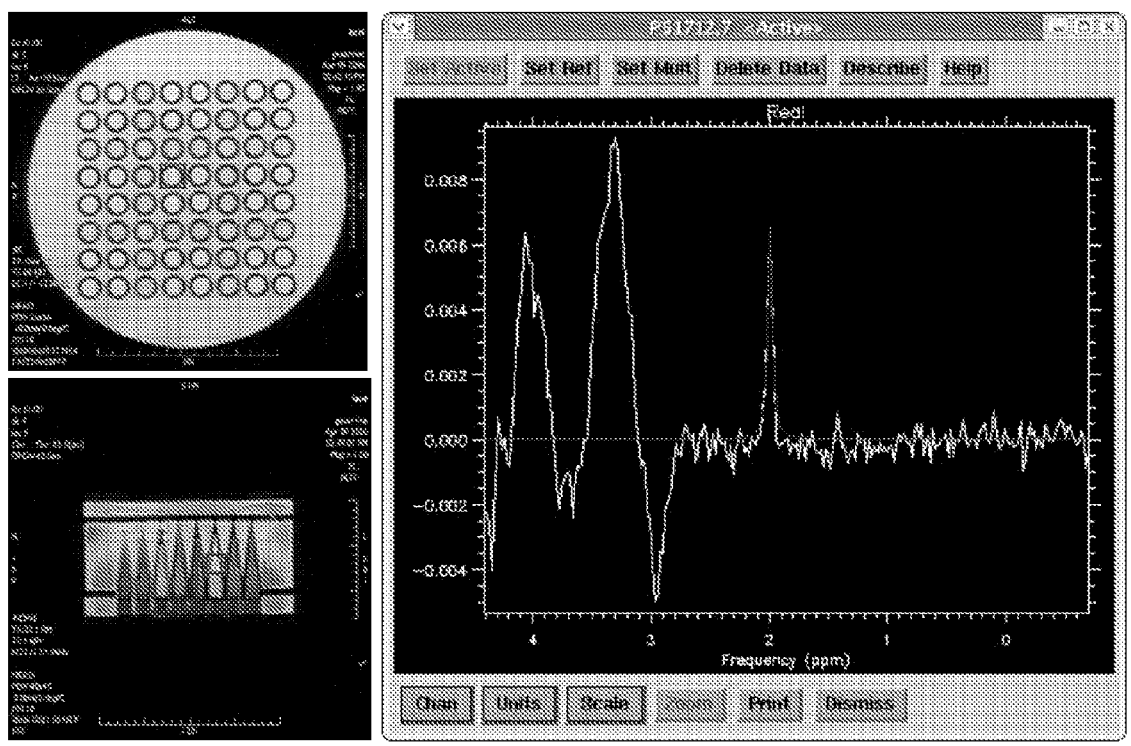
Figure 5C:
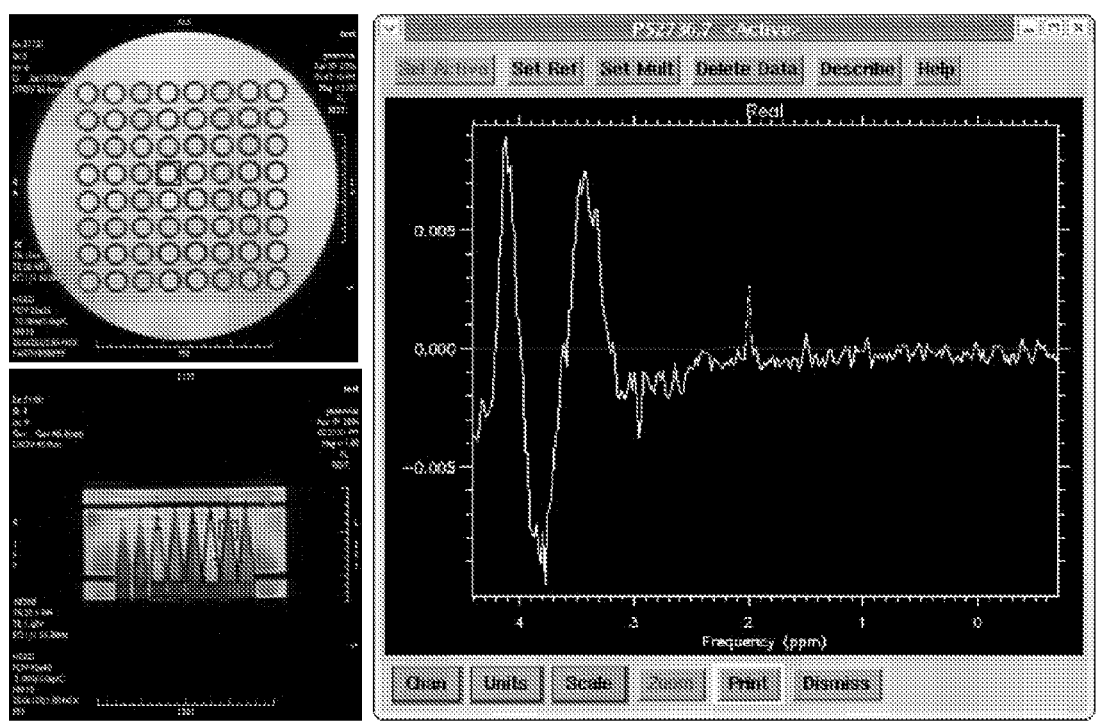
Figure 6:
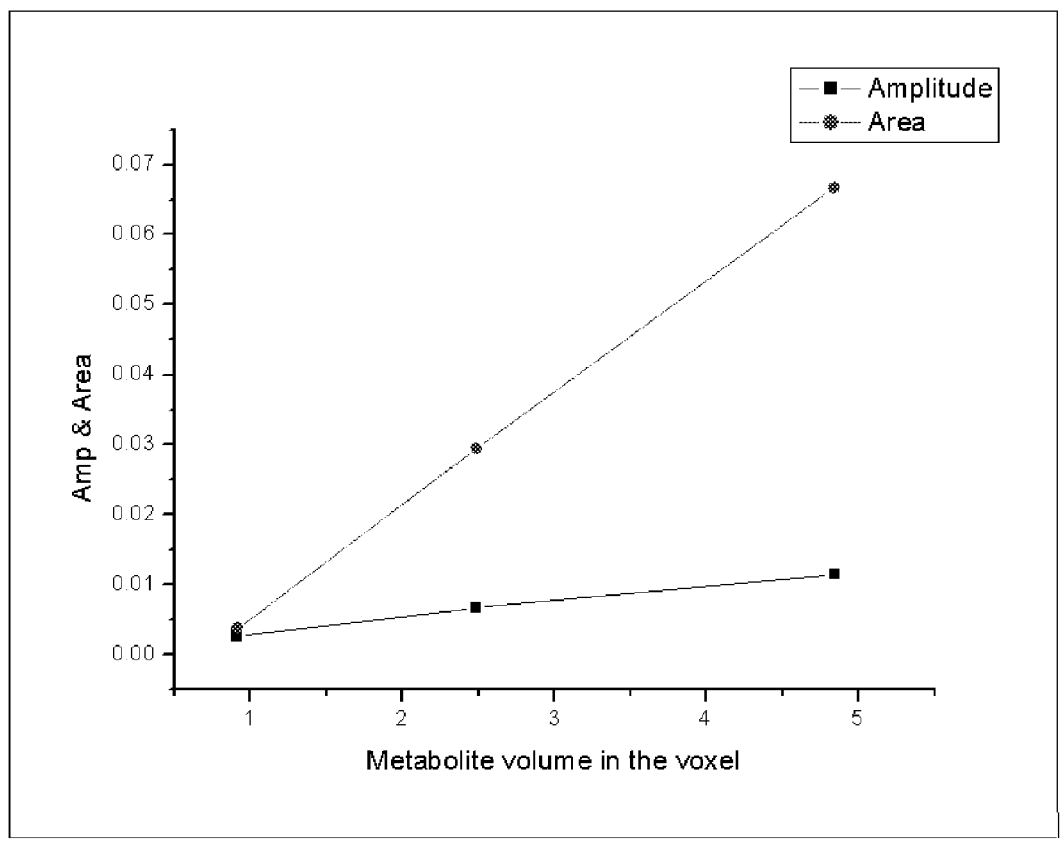
FIG. 6 shows NAA metabolite quantification using an 8×8 cone-shape phantom, in which area and amplitude have a linear relationship with the metabolite volume in the voxel.
Figure 7A:
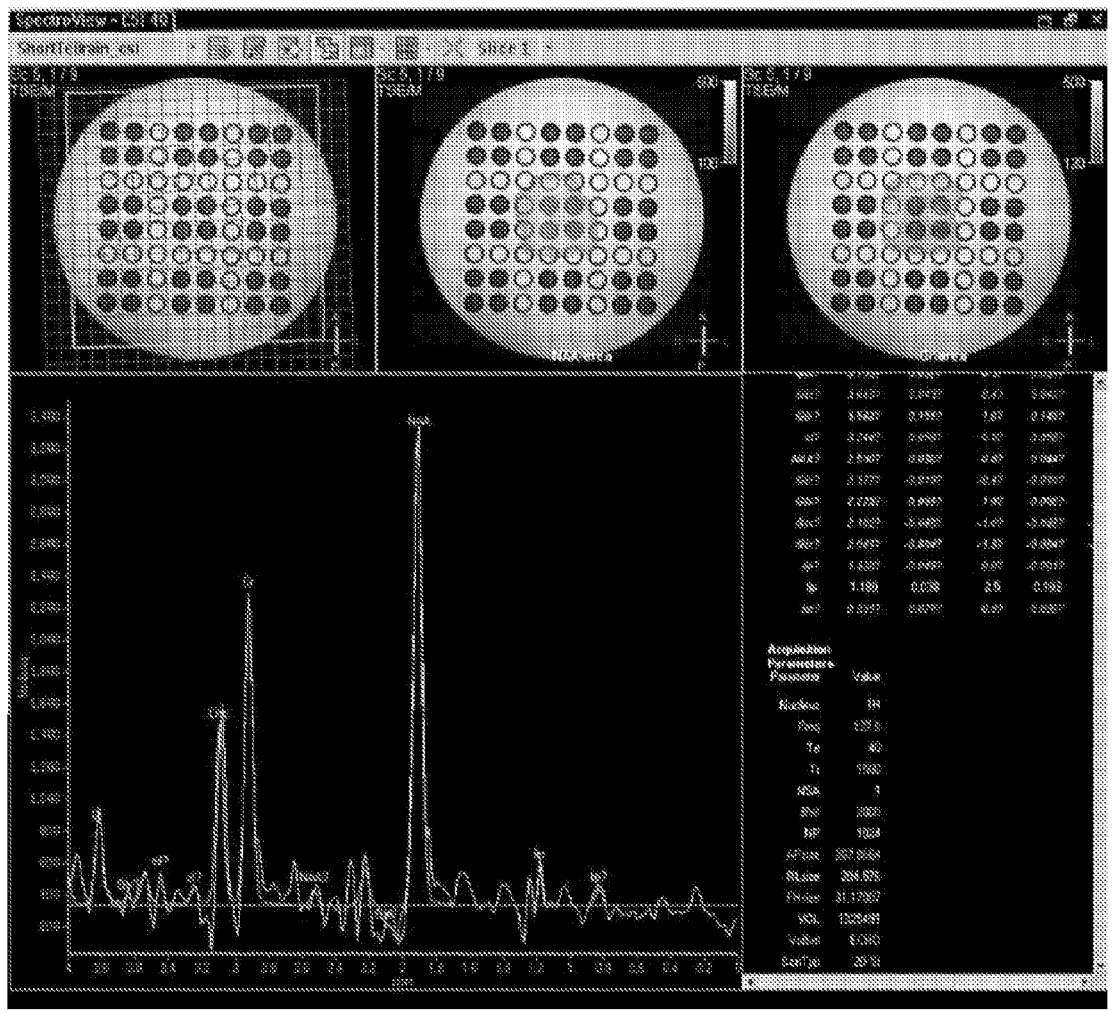
Figure 7B:
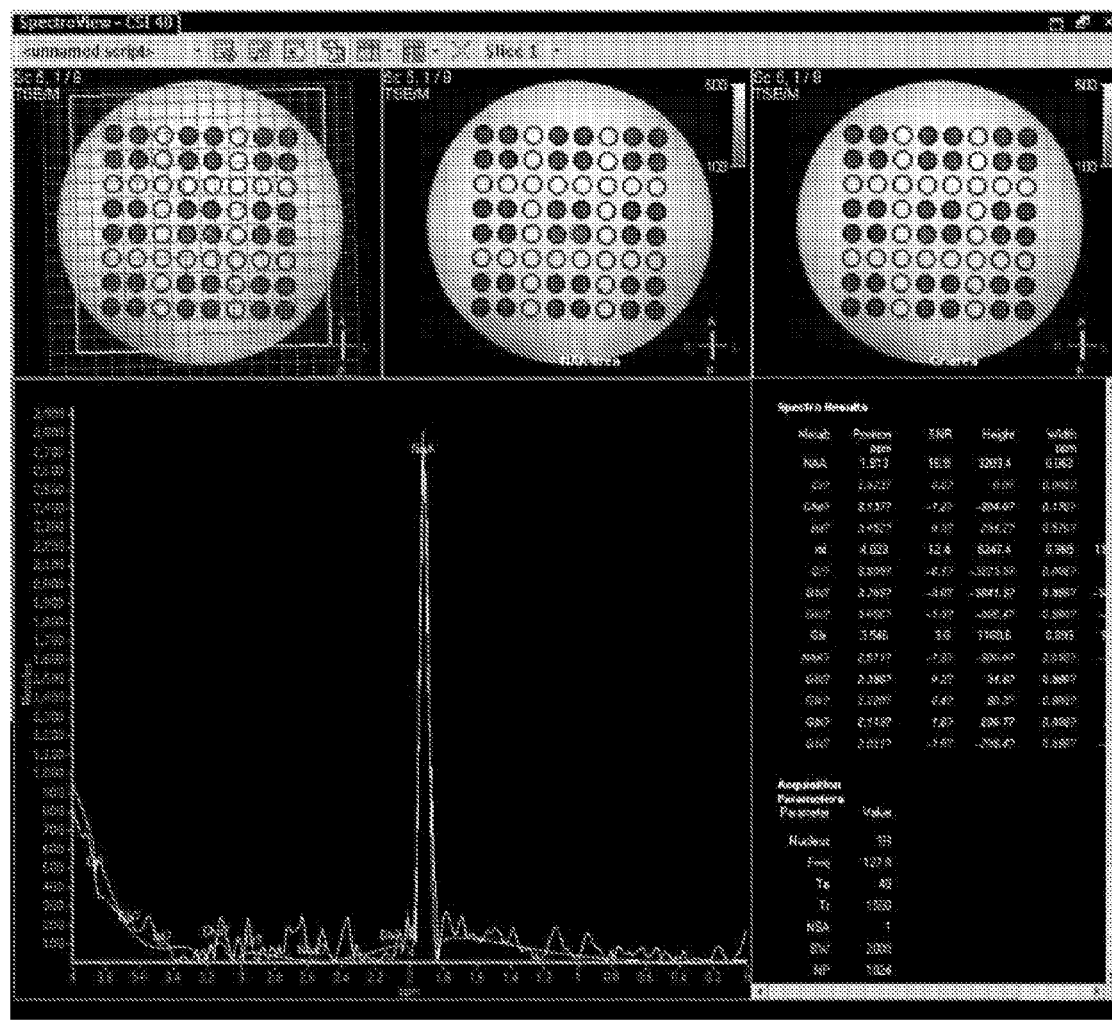
Figure 7C:
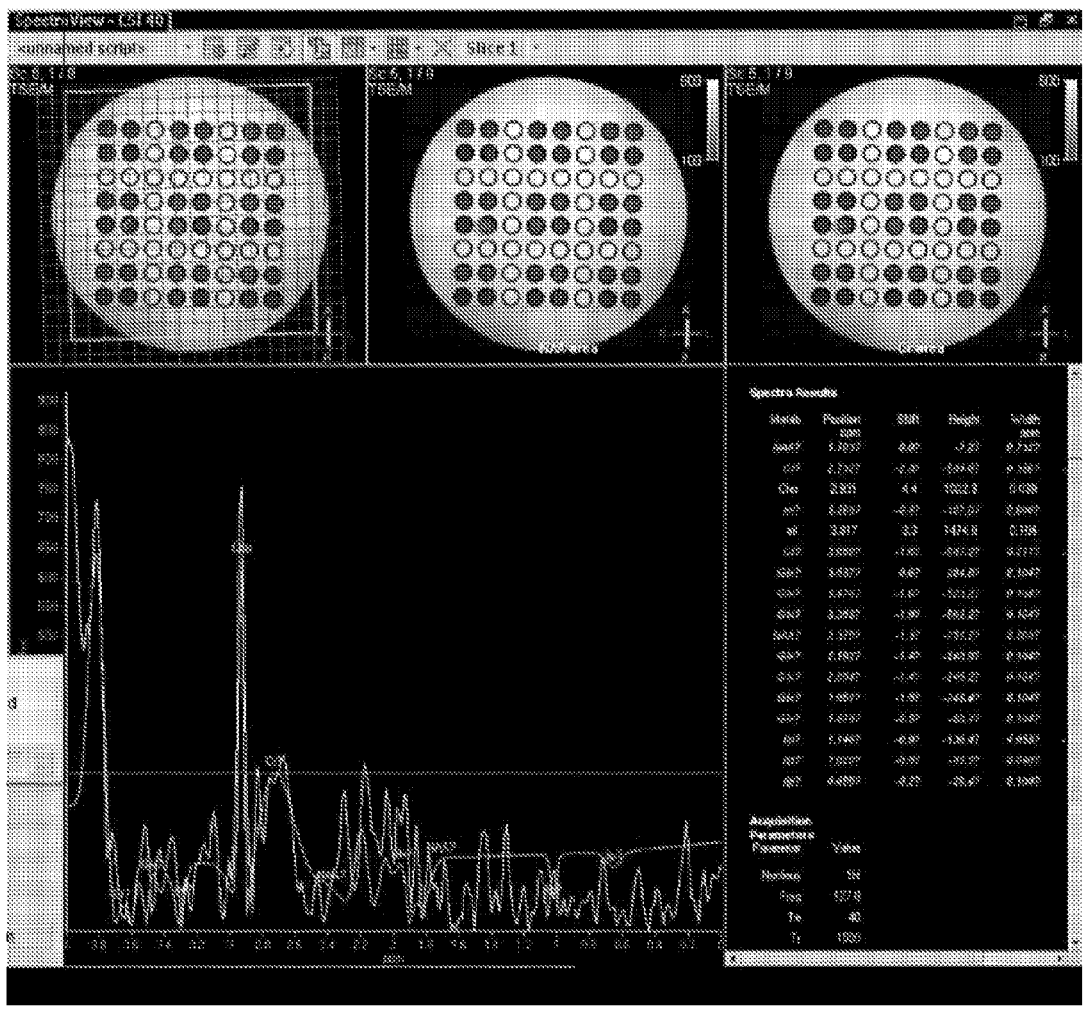
Figure 7D:
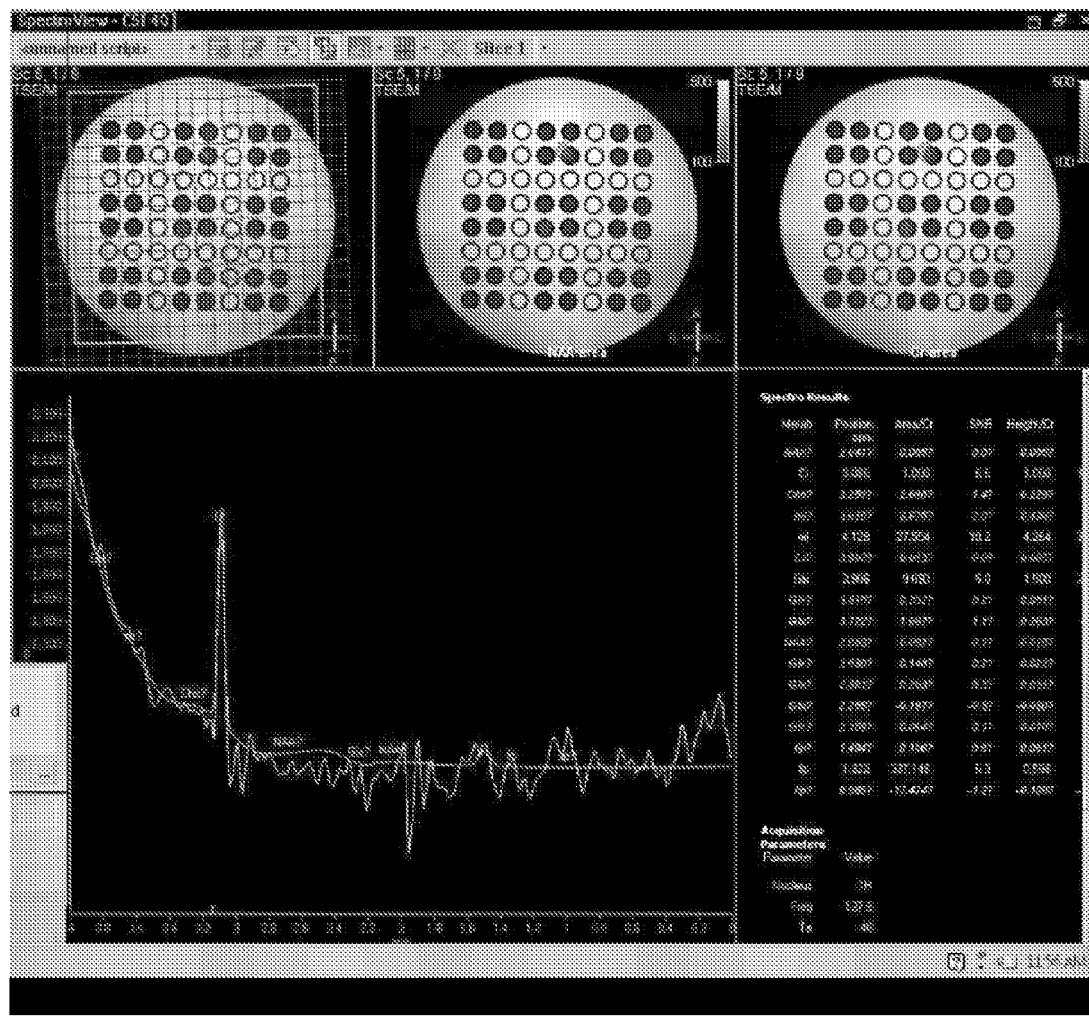

FIG. 5 shows the position of the voxel on the T1-weighted MR scout image (axial and coronal) and the NAA spectrum. The estimated metabolite volumes in the VOI of FIG. 5 (a), (b) and (c) were about 4.8433, 2.4871 and 0.9163 cm3, respectively. The amplitude, area and FWHM of the NAA peak in FIG. 5(a) were 0.01147, 0.06675 and 3.7048, respectively, and those of FIG. 5(b) were 0.00669, 0.0295 and 2.8078, respectively, and those of FIG. 5(c) were 0.00272, 0.00381 and 0.8926, respectively. Thus, the relationship between the area and amplitude and the metabolite volume of the voxel was linear, as is shown in FIG. 6. As can be seen in FIG. 6, the area and amplitude were proportional to the metabolite volume in the voxel. The metabolite quantification by the area of a spectrum was more sensitive than that by its amplitude. In FIG. 7, the solution diluted with the only one metabolite was darker than another vial due to the short T1 effect by the Magnevist™.

EXAMPLE 2

Evaluation of MVS

MVS was performed using the 3T Philips MR scanner (Model: Achiva) at the East-West Neo Medical Center, Kyung-Hee University of Korea. The MR system we used for metabolite quantification of the SVS only had an automatic first order shimming control mode, so a MVS experiment was impossible. The MVS study was processed with setting the $2^{nd}$ order shimming. It has previously been shown in brain studies that the use of higher order shims, compared with linear terms alone, yields approximately a 30% greater volume of brain tissue with adequate shim for spectroscopic imaging. In addition, regional analysis showed significant improvement for the homogeneity within specific areas of the brain, and particularly those near the skull. Therefore, for 2D-MVS, an in-house-developed shimming procedure was employed that used the scanner's first and second order shim coils. After shimming, an axial scout scan was done to localize the calibration vials, and the phantom was evaluated with a 2D point resolved spectroscopy (PRESS) MRS pulse sequence. The SVS parameters used were as follows: room temperature, TE/TR=40/1500 ms, 20×20 array CSI grid, voxel size=15×15×30 $mm^3$, NEX=1 and 1024 data points. The MVS data sets were transferred offline for processing with the program of the Philips console system and we are to confirm the possibility of using the phantom to take advantage of the 2D and 3D MVS.

The metabolite spectra from the cone-shape phantom were obtained. For the brain mimicking dilution spectrum, the peaks of NAA (2.0 ppm), Cr (3.0 ppm) and Cho (3.2 ppm)

were clearly observed. Only the characteristic peaks in the NM, Cr and Cho spectra were observed in spite of a little noise (FIG. 7). FIG. 7 shows the selected voxel positions on the grid (20×20) and the metabolite spectra. Altogether, it can be seen that the central metabolite spectra were clearer than the edge's spectra because of the shimming condition generated by phantom's water.

Discussion

As described above, we developed and evaluated the 8×8 cone-shape phantom in order to determine the SVS/MVS accuracy of a MR system.

First, the evaluation of the SVS was performed via metabolite quantification of the NM. As see in the results, the NAA (2.0 ppm peak) peaks were focused upon and the other peaks (specially >>2.0 ppm) were ignored because only NM was in the VOI. Unexpected peaks that the inhomogeneity of the $B_0$ or $B_1$ magnetic field caused in the MRS are seen in FIG. 5. In order to eliminate these unexpected peaks, high order shimming and development of the phantom's uniformity was required. If investigators take advantage of this relationship between the shimming state of a MR system and the quality of the MR spectrum, they can evaluate the shimming performance of each MR system with using a MRS phantom. So, we expect that this 8×8 cone-shape phantom accomplished the function. The high order shimming depends on ability of the MR system, and the phantom's uniformity can be developed to make the thickness of the inner cone-shape vials thinner. Through metabolite quantification of NM in the SVS, we confirmed that the relationship between the quantity of a metabolite and the specifications of its MRS peak were mostly linear. Further, it was confirmed that the metabolite quantification with the peak area has much higher resolution than the peak amplitude. Consequently, these results mean that the partial volume effect was not at all affected by the MRS peak. Although metabolite quantification was conducted with NAA in this study, which is the representative metabolite of $^1$H-MRS, the metabolite quantification of other metabolites can be also performed.

Because Magnevist™ was diluted in the brain-mimicking solution and water was included in the copper sulfate, their T1 times were shorter. Thus, the solution diluted with the only one metabolite showed as darker than that of another vials (FIG. 7).

The next step, i.e., the evaluation of MVS, was conducted as the analysis of the NM, Cho, Cr and a brain mimicking solution spectrum. Because the MVS resolves the chemical shift, the $B_0$ inhomogeneity does not, to first order, spatially distort the images. Poorer shimming may result in compromised solvent suppression and poor image slice profiles because the slice-selective radiofrequency pulses may be less than perfect, which in turn causes problems for the spectra from the voxels near the outside of the CSI volume. Hence, high order shimming is necessarily required to examine the 8×8 cone-shape phantom. With the higher order shimming, higher quality and the more accurate results can be obtained. In this study the ROI of the MVS was selected at the center region because of the shimming.

NM, Cr, Cho and the human brain mimicking solution spectra were shown in the ROI of the MVS. It was observed that the NM spectrum of the MVS was similar to that of the SVS. The Cr and Cho spectra had similar shapes to those cut from the human brain mimicking solution (FIG. 7). Therefore, these results were evidence that the 8×8 cone-shape phantom was useful for the SVS as well as the MVS. The quantification of each metabolite is also possible in the MVS such as the SVS. Although the ROI of the MVS was also selected in the center and some main metabolites were chosen, if the shimming order is higher, then investigators can select other metabolites in the outer region.

Metabolite quantification is possible for the volume in the voxel because this phantom had a cone-shape metabolite vial. Further, this phantom was optimized by constructing the 8×8 array vial. In addition, with using these functions, a variety of MR systems can be compared and evaluated quantitatively. For example, the spectrum resolutions can be compared in accordance with the tesla strength of the MR systems and the shimming test can be done using this phantom. Ultimately, the purpose of 8×8 cone-shape phantom is to obtain the best performance of a MR system by checking it frequently.

The use of metabolic and functional imaging methods are currently increasing in clinical medicine. Among the many issues, one of the most important is to ensure the accuracy of the obtained metabolic information. In the case of MVS, which is one of the most promising of these techniques, the accuracy of the measured metabolite intensities and resulting voxel quantitative indices must be ensured. Hence, the present invention demonstrates an efficient solution for evaluation of MR spectroscopy, This quality assurance procedure is easy to reproduce for MR physicists and spectroscopists, and it can be performed on a regular basis, perhaps annually or as part of the commissioning of a new scanner or as a software/pulse-sequence update such as ultra high speed EPSI.

While the present invention has been particularly shown and described with reference to exemplary embodiments thereof, it will be understood by those of ordinary skill in the art that various changes in form and details may be made therein without departing from the spirit and scope of the present invention as defined by the appended claims.

What is claimed is:

1. A phantom configured for evaluating a magnetic resonance spectroscopy (MRS) performance when an MRS measurement process is performed using a magnetic resonance imaging (MRI) apparatus, the phantom comprising:
   an external container having a cylindrical shape and an open upper end;
   a plurality of internal containers configured to include metabolites, the internal containers having the same size and a cone shape and arranged in a matrix shape in the external container;
   an external container cover configured to cover the open upper end of the cylindrical external container; and
   at least one internal container stopper configured to close an upper part of an internal container among the plurality of internal containers.

2. The phantom of claim 1, further comprising one or more engagement members configured to engage the external container with the external container cover.

3. The phantom of claim 1, wherein the internal containers are arranged in an 8×8 matrix shape.

4. A phantom configured for quantitatively evaluating a single voxel spectrum or multi-voxel spectrum obtained when a chemical shift imaging magnetic resonance spectroscopy measurement process is performed using a magnetic resonance imaging apparatus, the phantom comprising:
   an external container having a cylindrical shape and an open upper end;
   a plurality of internal containers configured to include metabolites, the internal containers having the same size and a cone shape and arranged in a matrix shape in the external container; and
   an external container cover configured to cover the open upper end of the cylindrical external container.

5. The phantom of claim 4, further comprising one or more engagement members configured to engage the external container with the external container cover.

6. The phantom of claim 4, wherein the internal containers are arranged in an 8×8 matrix shape.

7. The phantom of claim 4, further comprising one or more internal container stoppers configured to close the upper parts of the internal containers.

* * * * *